(12) United States Patent
Jung et al.

(10) Patent No.: US 7,757,156 B2
(45) Date of Patent: Jul. 13, 2010

(54) REED-SOLOMON DECODING APPARATUS AND METHOD HAVING HIGH ERROR CORRECTION CAPABILITY

(75) Inventors: Joon-Young Jung, Daejon (KR); O-Hyung Kwon, Daejon (KR); Soo-In Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1009 days.

(21) Appl. No.: 11/501,496

(22) Filed: Aug. 8, 2006

(65) Prior Publication Data

US 2007/0157068 A1 Jul. 5, 2007

(30) Foreign Application Priority Data

Nov. 9, 2005 (KR) ...................... 10-2005-0107048

(51) Int. Cl.
*H03M 13/00* (2006.01)
(52) U.S. Cl. ...................... 714/784; 714/762
(58) Field of Classification Search .................. 714/758, 714/762, 784
See application file for complete search history.

(56) References Cited

U.S. PATENT DOCUMENTS 6,304,994 B1 * 10/2001 Oh et al. ...................... 714/784
6,367,046 B1    4/2002 Chapman et al.
6,374,384 B1 *  4/2002 Ohta et al. .................... 714/784
7,322,004 B1 *  1/2008 Yu et al. ...................... 714/784

FOREIGN PATENT DOCUMENTS

| JP | 11-136136 | 5/1999 |
|---|---|---|
| KR | 10-1998-0017787 | 6/1998 |
| KR | 2000-0061196 | 10/2000 |
| KR | 1020030013013 | 2/2003 |
| KR | 1020030013013 A | 2/2003 |
| KR | 1020040073642 A | 8/2004 |

* cited by examiner

*Primary Examiner*—Sam Rizk
(74) *Attorney, Agent, or Firm*—Blakely, Sokoloff, Taylor & Zafman LLP (57) ABSTRACT

A Reed-Solomon (RS) decoding apparatus having high error correction capability and a method thereof are provided. The apparatus includes: error location and analysis polynomial generating units for performing a modified Euclid algorithm by receiving syndrome data upon receipt of an enable signal, and suspending input of the syndrome data and outputting error location polynomial data and error analysis polynomial data by executing the modified Euclid algorithm independently upon receipt of a disable signal; a controlling unit for controlling the error location and analysis polynomial generating unit and the input of the syndrome data; and switching units for providing the syndrome data to corresponding error location and analysis polynomial generating unit upon receipt of the enable signal and controlling the input of the syndrome data upon receipt of the disable signal. The number of the switching units is identical to that of the error location and analysis polynomial generating units.

7 Claims, 9 Drawing Sheets

REED-SOLOMON DECODING APPARATUS AND METHOD HAVING HIGH ERROR CORRECTION CAPABILITY

FIELD OF THE INVENTION

The present invention relates to a Reed-Solomon (RS) decoding apparatus having a high error correction capability and a method thereof; and, more particularly, to a Reed-Solomon (RS) decoding apparatus having a high error correction capability for increasing a processing speed without increasing an operating clock, while having a minimum hardware complexity, and a method thereof.

DESCRIPTION OF RELATED ARTS

Decoding of a Reed-Solomon (RS) code is an operation of finding the location and the size of an error using that the RS codeword is divided by a generator polynomial g(x). The RS decoding includes steps of calculating syndrome, generating an error location and analysis polynomial, generating an error polynomial and correcting an error.

Figure 1:
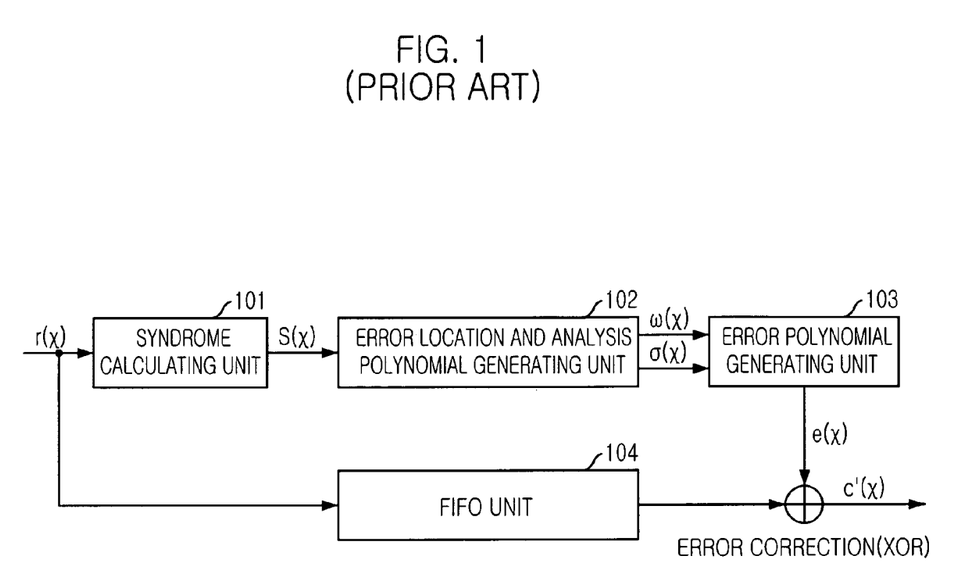
FIG. 1 is a block diagram illustrating a RS decoder in accordance with the related art.

FIG. 1 is a block diagram illustrating a RS decoder in accordance with the related art. The RS decoder according to the related art includes a syndrome calculating unit 101, an error location and analysis polynomial generating unit 102, an error polynomial generating unit 103 and a FIFO unit 104.

The RS decoder according to the related art receives a codeword r(x) that is traveled through a channel after transmitting. Then, the syndrome calculating unit 110 calculates a syndrome s(x) of the received codeword and transmits the syndrome s(x) to the error location and analysis polynomial generating unit 102. The error location and analysis polynomial generating unit 102 generates an error location polynomial σ(x) and an error analysis polynomial ω(x) by receiving the syndrome s(x). The generated error location polynomial σ(x) and the error analysis polynomial ω(x) are inputted to the error polynomial generating unit 103 and the error polynomial generating unit 103 generates an error polynomial e(x) using the generated error location polynomial σ(x) and error analysis polynomial ω(x). When the error polynomial e(x) is generated, the codeword r(x) is applied into the error polynomial e(x) by performing an XOR operation. As result, the RS decoder outputs data c'(x) which is an estimated data of data c(x) transmitted from a transmitter.

A RS code is generally expressed as (n, k), where n denotes a length of a codeword, that is, the number of RS symbols, and k denotes the length of information included in the codeword. An error correction capability t is expressed as following Eq. 1.

$$t = \frac{n-k}{2} \quad \text{Eq. 1}$$

The error correction capability t means that t symbol errors in a codeword can be corrected.

The present invention relates to a RS decoding apparatus and a method thereof for overcoming a conventional problem in which a calculation complexity of a RS decoder increase as the error correction capability t grows. Especially, the present invention relates to the error location and analysis polynomial generating unit 102 in the RS decoder shown in FIG. 1. Until now, many methods for obtaining an error location and analysis polynomial have been introduced.

A Berlekamp-Messy algorithm, a Peterson-Gorenstein-Zierler algorithm, a Fourier transform algorithm, a Euclid algorithm and a modified Euclid algorithm are well-known conventional methods for obtaining an error location and analysis polynomial. Among them, the modified Euclid algorithm is a simple and easy-applicable algorithm for generating an error location polynomial and an error analysis polynomial comparatively. Hereinafter, problems of a conventional RS decoder using the modified Euclid algorithm will be described.

The operation of the RS decoder basically includes receiving a sequence of consecutive RS codewords, RS-decoding the received RS codewords, and outputting a sequence of information data. In FIG. 1, as the error correction capability t grows, the syndrome calculating unit 101 and the error polynomial generating unit 103 maintains a processing amount or a processing time constantly, whereas they may have more complex structure.

Figure 2:
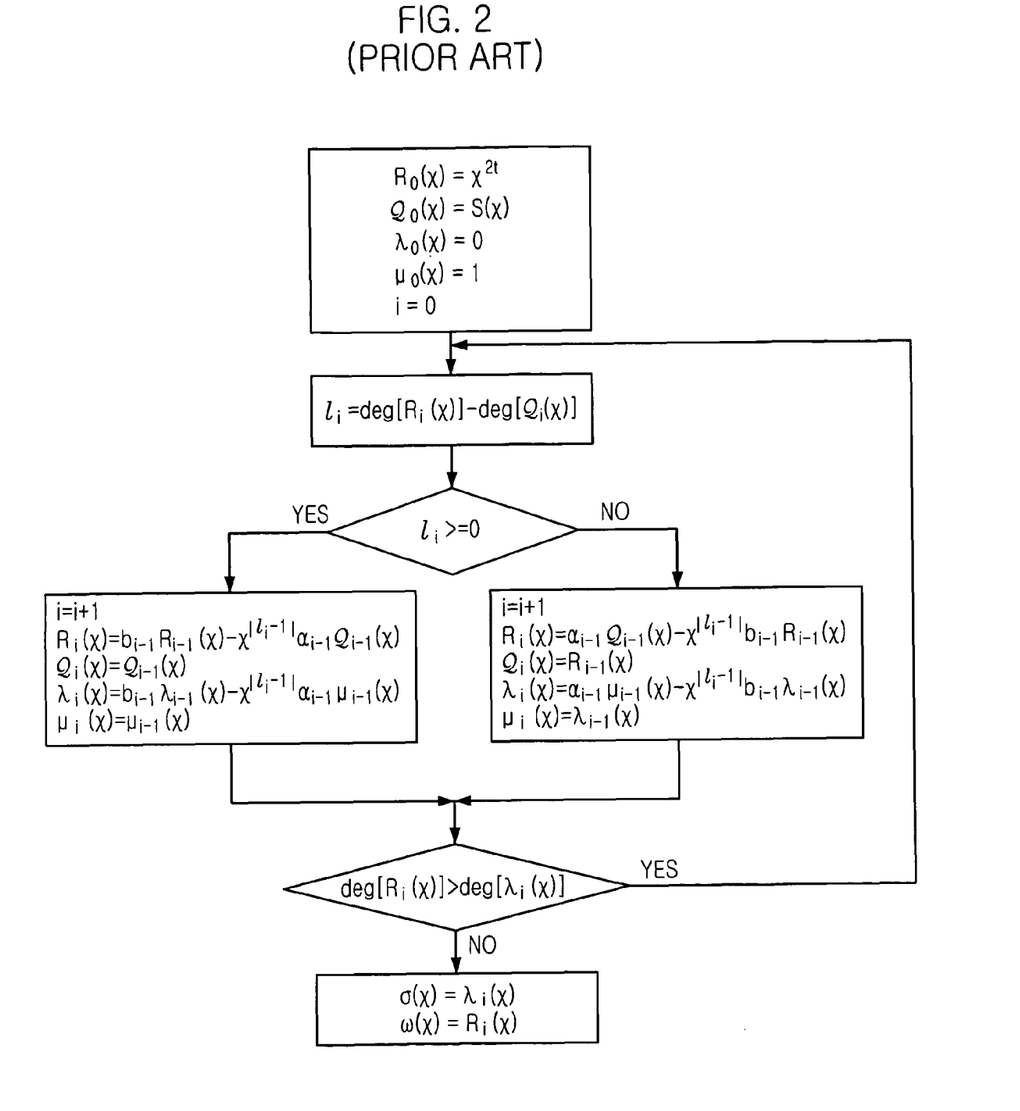
FIG. 2 is a flowchart of performing a modified Euclid algorithm in accordance with the related art.

In order to generate the error location polynomial and the error analysis polynomial, the modified Euclid algorithm reduces an order of $R_i(x)$ and $Q_i(x)$ by multiplying the leading coefficients of each polynomial to two polynomials $R_0(x) = x^{2t}$ and $Q_0(x) = s(x)$, wherein the leading coefficients are $a_0$ and $b_0$.

initial condition $$R_0(x)=x^{2t}, Q_0(x)=S(x), \lambda_0(x)=0, \mu_0(x)=1, i=0$$

steps for calculating $$R_i(x) = [\sigma_{i-1}b_{i-1}R_{i-1}(x) + \overline{\sigma_{i-1}}a_{i-1}Q_{i-1}(x)] + \quad \text{Eq. 2}$$
$$x^{|l_{i-1}|}[\sigma_{i-1}b_{i-1}Q_{i-1}(x) + \overline{\sigma_{i-1}}a_{i-1}R_{i-1}(x)]$$

$$\lambda_i(x) = [\sigma_{i-1}b_{i-1}\lambda_{i-1}(x) + \overline{\sigma_{i-1}}a_{i-1}\mu_{i-1}(x)] +$$
$$x^{|l_{i-1}|}[\sigma_{i-1}b_{i-1}\mu_{i-1}(x) + \overline{\sigma_{i-1}}a_{i-1}\lambda_{i-1}(x)]$$

$$Q_i(x) = \sigma_{i-1}Q_{i-1}(x) + \overline{\sigma_{i-1}}R_{i-1}(x)$$

$$\mu_i(x) = \sigma_{i-1}\mu_{i-1}(x) + \overline{\sigma_{i-1}}\lambda_{i-1}(x)$$

$$l_{i-1} = \deg[R_{i-1}(x)] - \deg[Q_{i-1}(x)]$$

$$\sigma_{i-1} = \begin{cases} 1 & \text{if } l_{i-1} \geq 0 \\ 0 & \text{if } l_{i-1} < 0 \end{cases}$$

Eq. 2 may be expressed as a flowchart shown in FIG. 2. The operation shown in FIG. 2 can be summarized as follows.

a loop process is performed t times, where a right loop process is formed when $l_1 < 0$, and a left loop process is formed when $l_1 \geq 0$.

Herein, if m (<t) errors occur, the loop process is performed m times and is interrupted in the middle of the loop process accordingly.

Order of performing a loop process (pattern) At first, the left process is initially performed. Then, the left loop and the right loop are alternatively performed in sequence.

Analyze the results after performing each of the loop processes After performing the left processor, orders of polynomials R(x) and Q(x) become identical. After performing the right processor, the order of the polynomial R(x) becomes one order lower than the order of the polynomial Q(x).

Figure 3:
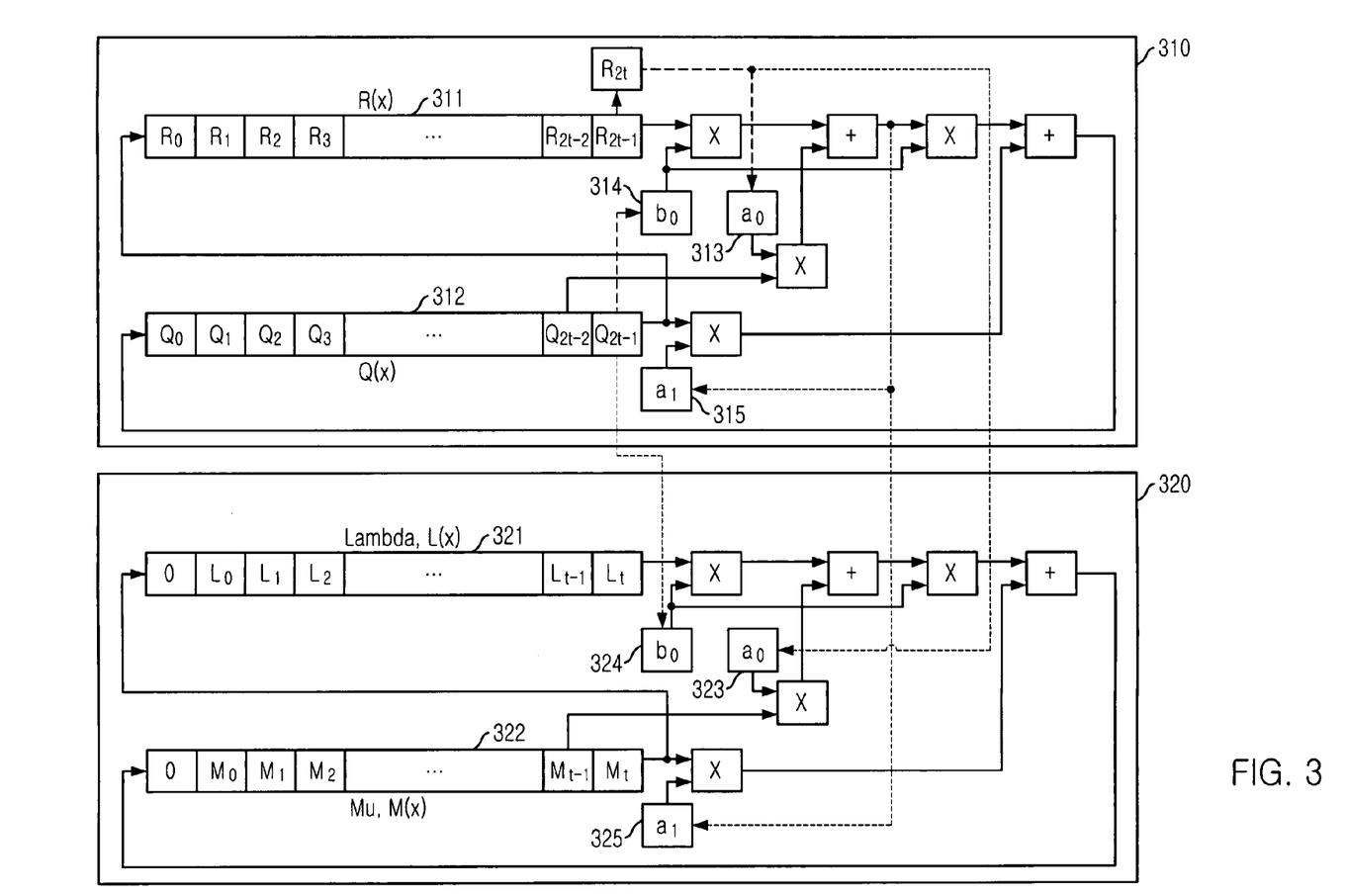
FIG. 3 is a circuit diagram for performing a modified Euclid algorithm.

FIG. 3 is a circuit diagram illustrating a conventional circuit structure for processing a modified Euclid algorithm. The shown circuit structure is introduced in the present invention in consideration of the steps shown in FIG. 2.

Referring to FIG. 3, the circuit structure for processing the modified Euclid algorithm includes an error analysis polynomial generating block 310 and an error location polynomial generating block 320. The number of registers for configuring R(x) 311, Q(x) 312, L(x) 321 and M(x) 322 are 2t+1, 2t, t+2 and t+2, respectively, according to the error correction capability t.

The operation of the error analysis polynomial generation block 310 in FIG. 3 will be described hereinafter.

At first, a single loop is defined as a set of operations for updating register values from $R_0$ to $R_{2t-1}$ and from $Q_0$ to $Q_{2t-1}$ of the R(x) 311 and the Q(x) 312 with new feed-backed values by shifting the register values by one blank to the right. Then, the single loop is performed as follows.

The register values of the R(x) 310 and the Q(x) 312 are updated with feed-backed values by being one-blank shifted at each clock. If the register values are updated for total 2t clocks, the register values of R(x) and Q(x) are completely updated. If the register values of the R(x) and the Q(x) are shifted at a next clock after the R(x) and the Q(x) are completely updated, the register values of R(x) and Q(x) are filled with 0 instead of feed-backed value. Also, an $a_0$ register 313, a $b_0$ register 314 and an $a_1$ register 315 are initialized by values stored in the R(x) and Q(x) register before the register values of R(x) and Q(x) are updated at each loop.

In the initialization step, the $a_1$ register 315 is initialized at a next clock after initializing the $a_0$ register 313 and the $b_0$ register 314. Therefore, in order to perform the one loop, 2 clocks for initializing the $a_0$ register 313, the $b_0$ register 314 and the $a_1$ register 315, and 2t+1 clocks for updating registers of R(x) and Q(x) are required. Therefore, the total 2t+3 clocks are required. The time of performing loops is decided by the number of RS symbols having an error in a codeword, and the reference thereof may be determined whether the register sequence of the Q(x) 312 is all zeros or not. That is, the loop is repeatedly performed as many as the number of error symbols. However, the number of performing the loop is limited to t times although more than t error symbols are included. Therefore, the operations of the error analysis polynomial generating circuit 310 performs the loop maximally t times. In order to synchronize the output of the error analysis polynomial generating circuit 310 with other frames, the error analysis polynomial generating circuit 310 outputs the result of the loop operations at the time of performing a $t^{th}$ loop although the error analysis polynomial generating circuit 310 performs the loops less than t times. Since the number of clocks required for performing one loop is 2t+3, the t loops requires t*2t+3) clocks. Herein, the clocks for initializing the registers of the R(x) and the Q(x) by receiving the initial syndrome data and for outputting the final error analysis polynomial are not considered since the clocks are very small compared to the clocks for performing the t times of Loop. The operation of the error location polynomial generating circuit 320 which is a lower circuit block 320 shown in FIG. 3 is very similar to the operation of the error analysis polynomial generating circuit 310. The error location polynomial generating operation requires t+1 clocks because the number of registers of the L(x) 321 and the M(x) 322 is t+2. However, the time of performing one loop is identical to the operation of the error analysis polynomial generating circuit 310 because the $a_0$ register 323, a $b_0$ register 324 and the $a_1$ register 325 use a value identical to the calculated values in the error analysis polynomial generating circuit 310. That is, the error location polynomial generating circuit 320 begins the operation identically to the operation of the error analysis polynomial generating circuit 310, and waits the error analysis polynomial generating circuit 310 to finish performing of loops after updating the registers of L(x) 321 and the M(x) 322. Then, the error location polynomial generating circuit 320 performs the loop with the error analysis polynomial generating circuit 320. Finally, the error location polynomial generating circuit 320 is operated to be synchronized with the operation of the error analysis polynomial generating circuit 310.

Therefore, in order to process the modified Euclid algorithm, the required number of clocks according to the error correction capability t is about t*(2t+3). Hereinafter, the problem occurs as the number of clocks increases will be described.

Figure 4:
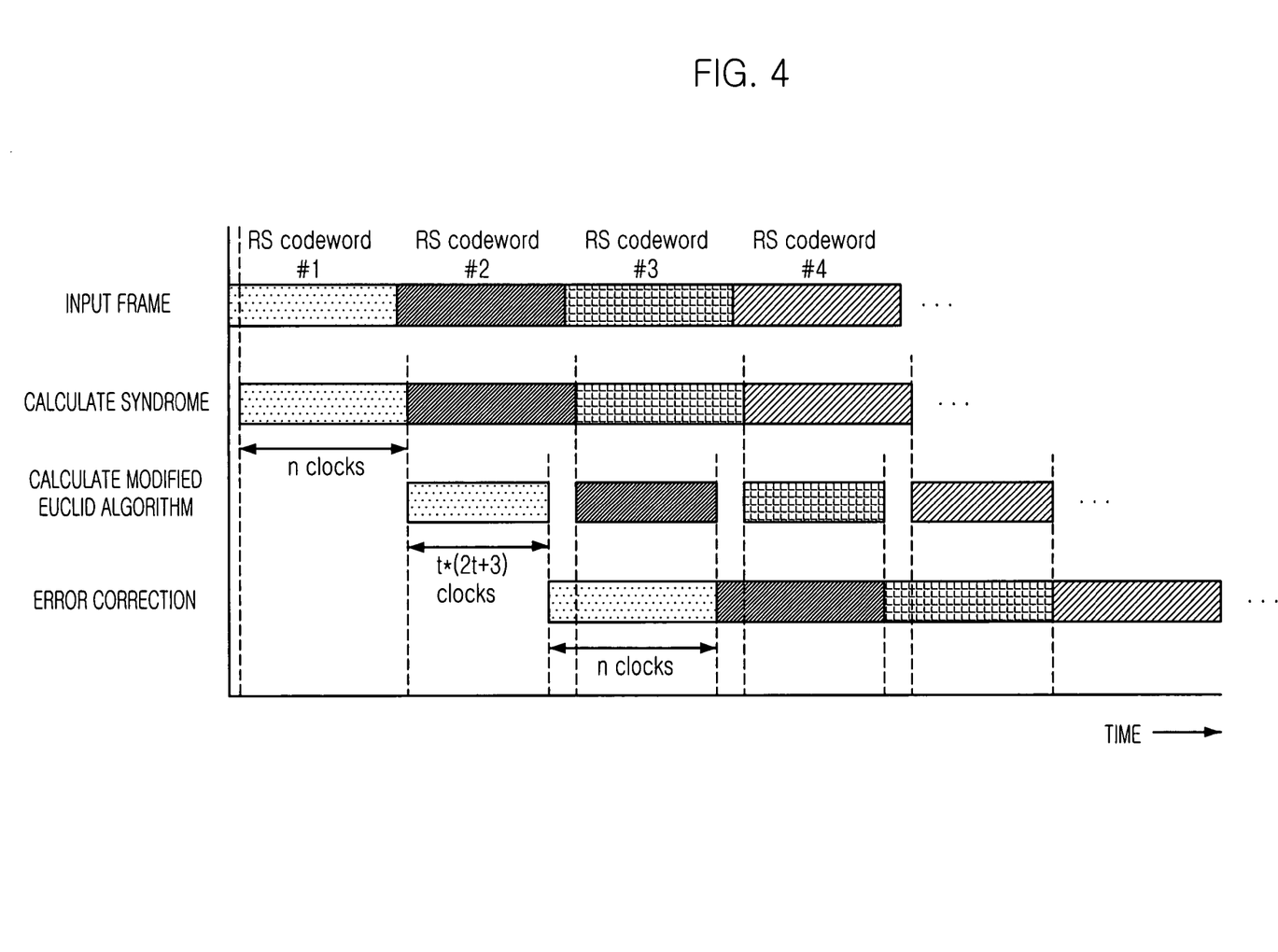
FIG. 4 is a timing diagram showing an order of data process in a RS decoder in accordance with the related art.

FIG. 4 is a timing diagram showing an order of data process in a RS decoder in accordance with the related art.

As shown in FIG. 4, the data frame is composed as a sequence of RS codewords. Also, a codeword includes n RS symbols. The calculation of syndrome is performed for a RS symbol inputted at each clock. That is, the calculated syndrome value is finally outputted after n clocks are passed, that is, after the RS symbols of one codeword are inputted. The outputted syndrome value is used to calculate the modified Euclid algorithm and the modified Euclid algorithm is performed for t*(2t+3) clocks. After t*(2t+3) clocks, the error analysis polynomial and the error location polynomial are generated. Two polynomials are generated using a Chine algorithm and a Forney algorithm. In FIG. 4, 'ERROR CORRECTION' denotes operation for correcting error of input data frame by generating the error polynomials using the Chien algorithm and Forney algorithm.

As shown in FIG. 4, the time required for calculating the modified Euclid algorithm is shorter than the time required for calculating the syndrome. That is, t*(2t+3) is smaller than n, where t*(2t+3) denotes the number of clocks required for the calculating the modified Euclid algorithm and n is the number clocks for calculating the syndrome. For example of RS, t is (n−k)/2. That is, t is 8. Therefore, the number clocks required for the calculating the Euclid algorithm is 8*(2*8+3)=152. That is, since n=204, the number of clocks required for calculating the modified Euclid algorithm is less than the number of clocks for calculating the syndrome. In this case, the RS decoder is operated as shown in the timing diagram of the FIG. 4. However, the RS decoder cannot be operated as shown in the timing diagram of FIG. 4 if the number of clocks required from the calculating the modified Euclid algorithm is greater than the time of clocks required for calculating the syndrome. In this case, the correct operation becomes impossible to be performed because a next syndrome data is inputted before completely calculating the modified Euclid algorithm for a current input syndrome data. As a result, the RS decoder can not be operated in real time.

Figure 5:
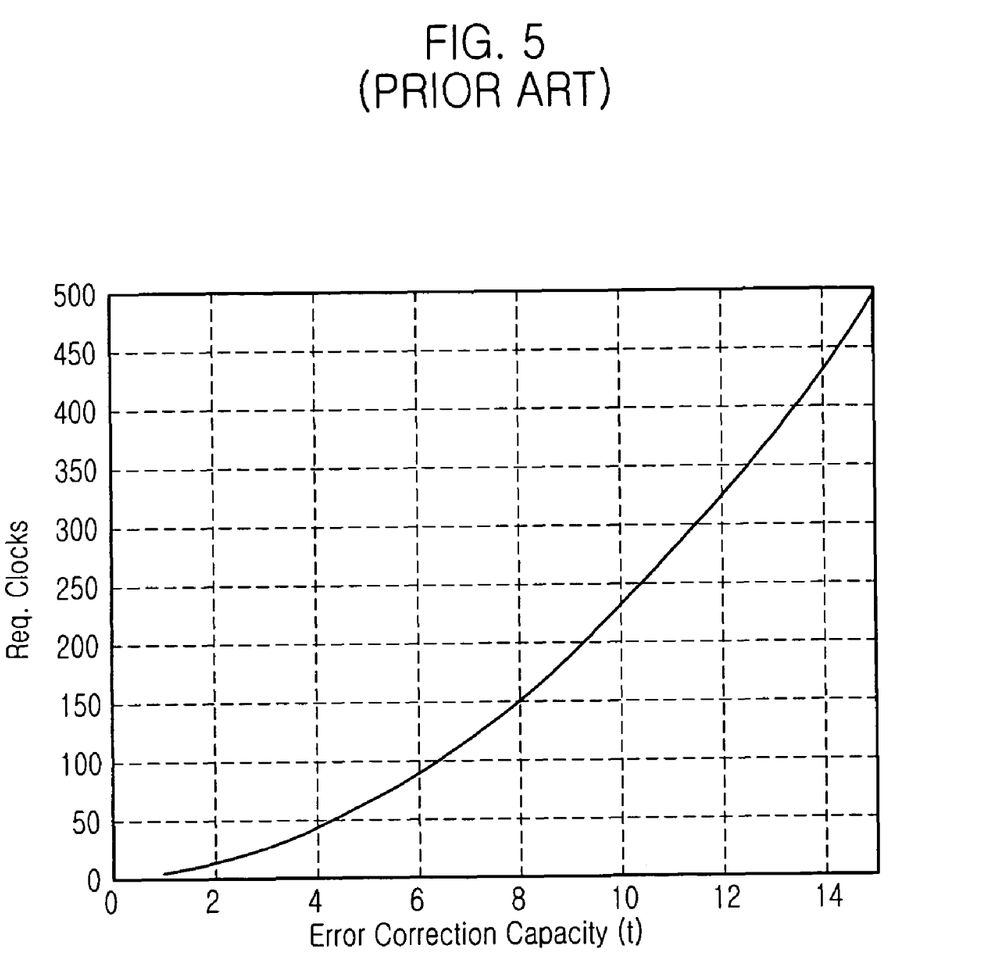
FIG. 5 is a graph showing increment of computation complexity required for processing a modified Euclid algorithm as an error correction capability of a RS code increases.

FIG. 5 is a graph showing increment of computation complexity required for processing a modified Euclid algorithm as an error correction capability of a RS code increases. That is, FIG. 5 shows the computation complexity of the modified Euclid algorithm according to the error correction capability t of the RS codeword.

As shown in FIG. 5, the computation complexity required form the error correction capability t increases geometric progression. In order to overcome such a problem, the easiest method is to drive the Euclid algorithm calculation block and the error location and analysis polynomial generating unit 102 in response to a faster clock. That is, a clock faster than a normal clock used for the syndrome calculating unit 101 is applied to the modified Euclid algorithm calculation block in order to complete the modified Euclid algorithm calculation faster than the syndrome calculation. However, there is a physical limitation for this method. That is, a faster clock cannot be used infinitely because of a computation amount per each clock and a physical radio wave delay.

As another method for overcoming this problem, a method of using a plurality of RS decodes was introduced. That is, the sequence of RS codewords consecutively inputted to the RS decoder is divided by a unit of a RS codeword, and the divided RS codewords are sequentially inputted to a plurality of RS decoders. Such a method does not require the clock speed to increase. However, the hardware complexity increases by the number of the RS decoders. The hardware complexity increases according to a processing time required for the Euclid algorithm calculation. If the processing time for the Euclid algorithm calculation takes two times more the processing time for the syndrome calculation, three RS decoder are require, of if the processing time for the Euclid algorithm calculation takes three times more than processing time for the syndrome calculation, four RS decoders are required.

Therefore, there is a great demand for embodying a RS decoder having a high error correction capability to have a minimum hardware complexity without increasing the operating clock of the modified Euclid algorithm calculation block which is an error location and analysis polynomial generating unit 102.

SUMMARY OF THE INVENTION

It is, therefore, an object of the present invention to provide a Reed-Solomon decoding apparatus having a high error correction capability for increasing a processing speed of an error location and analysis polynomial generating unit without increasing an operating clock thereof, while having a minimum hardware complexity.

In accordance with an aspect of the present invention, there is provided a Reed-Solomon decoding apparatus having a high error correction capability, which includes: a plurality of error location and analysis polynomial generating units for performing a modified Euclid algorithm by receiving syndrome data and informing an operating state between an active state and an operation completion state while executing the modified Euclid algorithm upon receipt of an enable signal, and suspending input of the syndrome data, and outputting error location polynomial data and error analysis polynomial data by executing the modified Euclid algorithm independently upon receipt of a disable signal; a controlling unit for controlling the error location and analysis polynomial generating unit and the input of the syndrome data by generating the enable signal and the disable signal according to the operating state; and a plurality of switching units for providing the syndrome data to corresponding error location and analysis polynomial generating unit upon receipt of the enable signal and controlling the input of the syndrome data into corresponding error location and analysis polynomial generating unit upon receipt of the disable signal, where the number of the switching units is identical to the number of the error location and analysis polynomial generating unit.

In accordance with another aspect of the present invention, there is also provided a method for Reed-Solomon decoding having a high error correction capability including the steps of: a) at a controlling unit, generating an enable signal in order to operate one of error location and analysis polynomial generating units; b) executing a modified Euclid algorithm by receiving syndrome data upon receipt of the enable signal at the error location and analysis polynomial generating unit, and receiving information about an operating state of the error location and analysis polynomial generating unit at the controlling unit; c) at the controlling unit, suspending the input of the syndrome data by generating and sending a disable signal to the error location and analysis polynomial generating unit, and receiving information about completion of an operation from the error location and analysis polynomial generating unit; and d) at the controlling unit, generating the enable signal and the disable signal in order to operate the error location and analysis polynomial generating unit independently from the other error location and analysis polynomial generating units and executing a modified Euclid algorithm in parallel.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Hereinafter, a Reed-Solomon decoding apparatus and method having a high error correction capability in accordance with a preferred embodiment of the present invention will be described in more detail with reference to the accompanying drawings.

Figure 6:
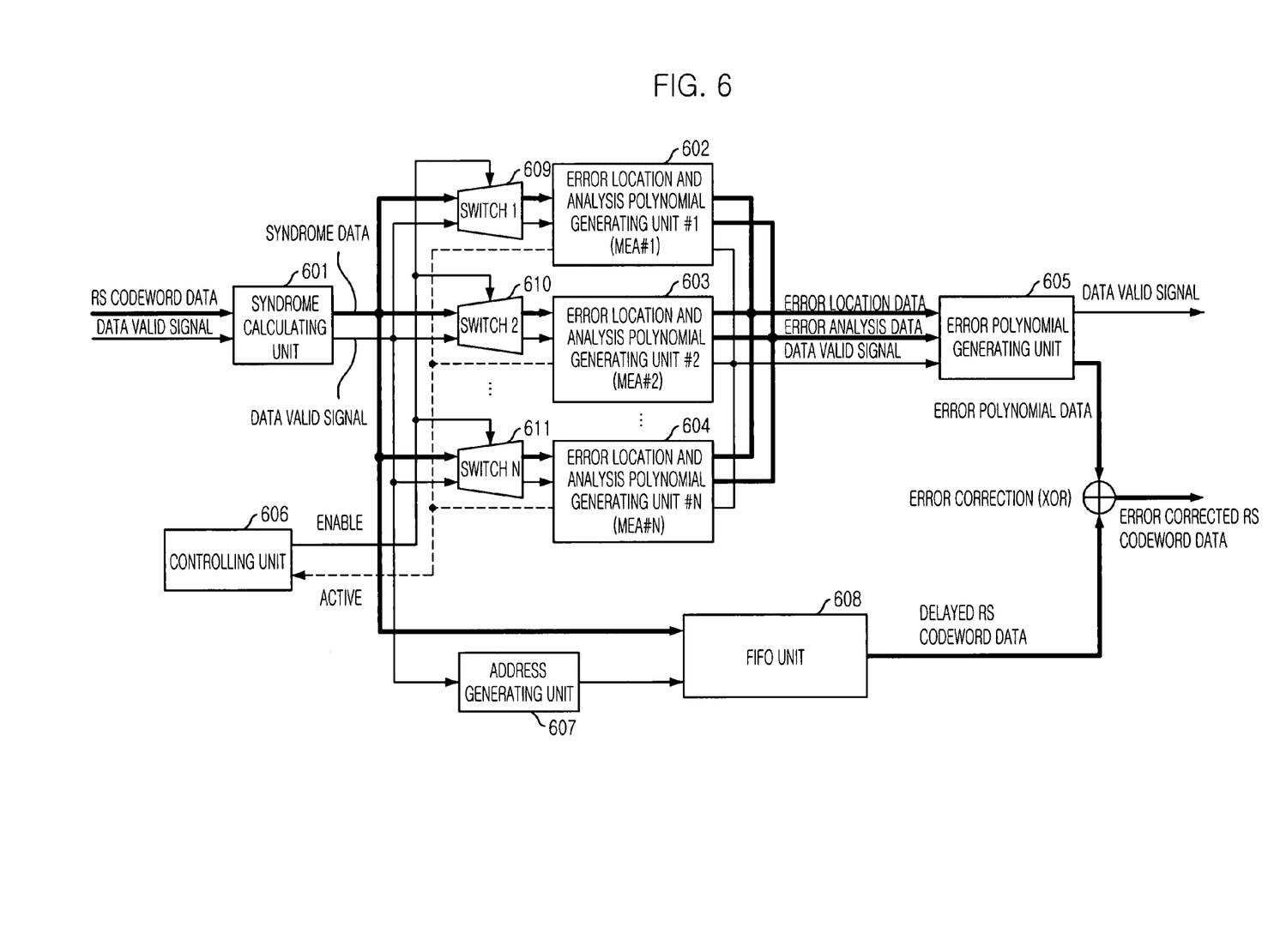
FIG. 6 is block diagram illustrating a Reed-Solomon (RS) decoding apparatus having a high error correction capability in accordance with a preferred embodiment of the present invention.

FIG. 6 is block diagram illustrating a Reed-Solomon (RS) decoding apparatus having a high error correction capability in accordance with a preferred embodiment of the present invention.

Referring to FIG. 6, the RS decoding apparatus according to the present embodiment includes a syndrome calculating unit 601, a plurality of error location and analysis polynomial generating units 602, 603 and 604, an error polynomial generating unit 605, a controlling unit 606, an address generating unit 607, a FIFO unit 608, and a plurality of switches 609, 610 and 611.

The error location and analysis polynomial generating units 602, 603 and 604 receive syndrome data in response to an enable signal and perform a modified Euclid algorithm. After receiving, the error location and analysis polynomial generating units 602, 603 and 604 inform states of operating such as an operating completion state and an active state, and the input of the syndrome data is interrupted in response to a disable signal. The error location and analysis polynomial generating units 602, 603 and 604 perform the modified Euclid algorithm independently or in parallel and output error location polynomial data and error analysis polynomial data.

The controlling unit 606 controls the error location and analysis polynomial generating units 602, 603 and 604 and the input of the syndrome data by generating the disable signal and the enable signal according to the operating state.

The RS decoding apparatus according to the present embodiment includes the switches 609, 610 and 611 as many as the number of the error location and analysis polynomial generating units 602, 603 and 604 in order to provide the syndrome data to corresponding error location and analysis polynomial generating unit in response to the enable signal outputted from the controlling unit 606 and to control the inputting of the syndrome data to the error location and analysis polynomial generating units 02, 603 and 604 in response to the disable signal.

Hereinafter, the operation of the RS decoding apparatus in accordance with a preferred embodiment of the present invention will be described in detail.

As shown in FIG. 6, the RS decoding apparatus having a high error correction capability according to the present embodiment includes a plurality of error location and analysis polynomial generating units 602, 603 and 604 and process the input data in parallel. Although one or more error location and analysis polynomial generating units 602, 603 and 604 do not completely end the processes thereof when the syndrome data is inputted from the syndrome calculating unit 601, the others may be operated to receive the input syndrome data. Therefore, the modified Euclid algorithm can be processed without delay. The number of error location and analysis polynomial generating units 602, 603 and 604 may vary according to a processing time.

Since each of the error location and analysis polynomial generating units 602, 603 and 604 is composed of a plurality of registers as shown in FIG. 3, the hardware complexity is not seriously increased although one or two error location and analysis polynomial generating units are added.

The RS decoding apparatus according to the present embodiment has a structure for exchanging a control signal between the error location and analysis polynomial generating units 602, 603 and 604 and the controlling unit 606 in order to add or to remove one or more error location and analysis polynomial generating units as many as the number of the error location and analysis polynomial generating units required to satisfy a computation complexity for processing the modified Euclid algorithm in real time. Therefore, the RS decoding apparatus according to the present embodiment is smoothly prepared and processes the modified Euclid algorithm although one or more of the error location and analysis polynomial generating units 602, 603 and 604 is added or removed.

Figure 7:
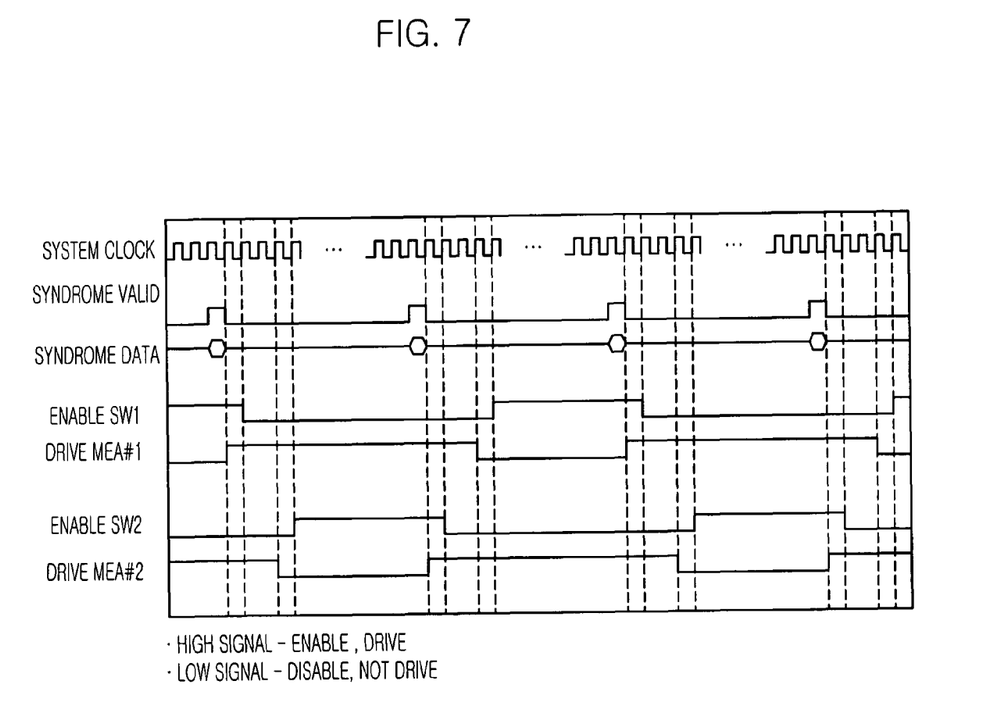
FIG. 7 is a time diagram illustrating a control signal flow related to output of syndrome data and process of modified Euclid algorithm.
Figure 8:
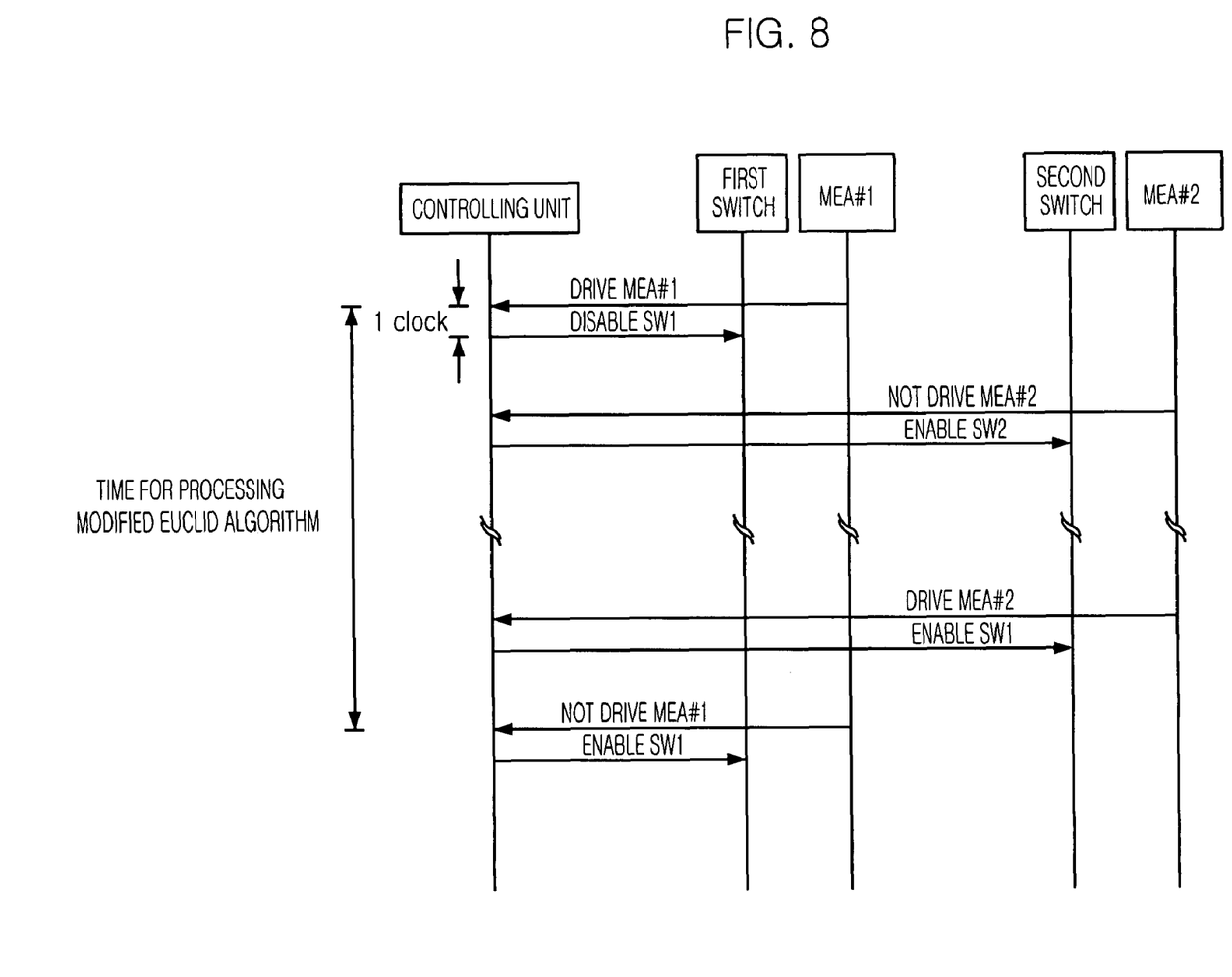
FIG. 8 is a diagram showing a control signal flow in FIG. 6 in a timing order.

FIG. 7 is a timing diagram illustrating a control signal flow for processing a modified Euclid algorithm related to outputting of syndrome data and FIG. 8 is a diagram showing a control signal flow in FIG. 6. That is, FIGS. 7 and 8 show exchanging control signals between error location and analysis polynomial generating units and corresponding switches or a controlling unit when the RS decoding apparatus includes two error location and analysis polynomial generating units.

Hereinafter, the operation of the RS decoding apparatus according to the present embodiment having two error location and analysis polynomial generating units for processing a modified Euclid algorithm without delay will be described.

At a first step, a first error location and analysis polynomial generating unit 602 and a second error location analysis polynomial generating unit 603 inform the controlling unit 606 that the error location and analysis polynomial generating units 602 and 603 are not driven when the RS decoding apparatus is initialized.

At a second step, the controlling unit 606 transmits an enable signal to a corresponding first switch 609 to drive the first error location and analysis polynomial generating unit 602 although it is possible to drive both of the error location and analysis polynomial generating units 602 and 603.

At a third step, if the syndrome calculating unit 601 outputs the calculated syndrome data, the calculated syndrome data is transferred to the first error location and analysis polynomial generating unit 602 through the first switch 609.

At a fourth step, the first error location and analysis polynomial generating unit 602 that receives the syndrome data transmits a signal to the controlling unit 606 in order to inform the controlling unit 606 that the first error location and analysis polynomial generating unit 602 begins to process the modified Euclid algorithm and is in an active state.

At a fifth step, when the first error location and analysis polynomial generating unit 602 informs the controlling unit 606, the controlling unit 606 sends a disable signal to the first switch 609 to turn off the first switch 609 and sends an enable signal to a second switch 610 to allow the second error location and analysis polynomial generating unit 603 to receive next inputted syndrome data.

At a sixth step, if the syndrome calculating unit 601 outputs the next syndrome data, the next syndrome data is inputted to the second error location and analysis polynomial generating unit 603 through the second switch 610.

At a seventh step, the second error location and analysis polynomial generating unit 603 sends a signal to the controlling unit 606 to inform the controlling unit 606 that the second error locate and analysis polynomial generating unit 603 begins to process the modified Euclid algorithm and is in the active state.

At an eighth step, when the second error location and analysis polynomial generating unit 603 inform the controlling unit 606, the controlling unit 606 sends a disable signal to the second switch 610 to turn off the second switch.

At a ninth step, the first error location and analysis polynomial generating unit 602 outputs error location polynomial data and error analysis polynomial data to the error polynomial generating unit 605 and informs the controlling unit 606 about the completion of the processing of the modified Euclid algorithm at the same time.

At a tenth step, the controlling unit 606 transmits an enable signal to the first switch 609 to allow the first error location and analysis polynomial generating unit 602 to receive a next syndrome data outputted after receiving the signal informing about completion of the process from the first error location and analysis polynomial generating unit 602.

At an eleventh step, the first and second error location and analysis polynomial generating units 602 and 603 alternatively perform the sixth step to the tenth step repeatedly.

Figure 9:
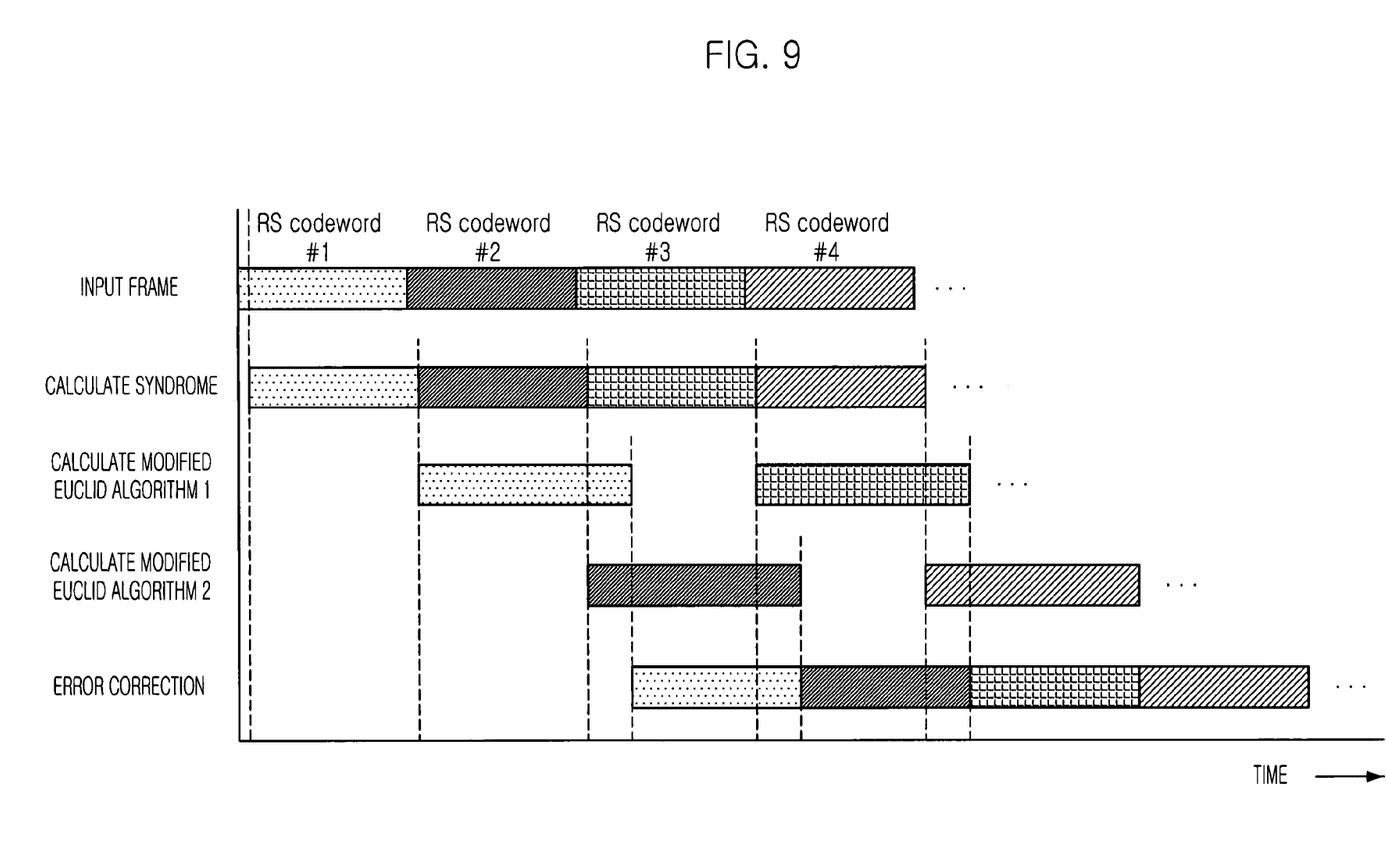
FIG. 9 is a graph showing increment of computation complexity required to process a modified Euclid algorithm as the error correction capability of the RS decoding apparatus grows.

FIG. 9 is a graph showing increment of computation complexity required to process a modified Euclid algorithm as the error correction capability of the RS decoding apparatus grows in accordance with a preferred embodiment of the present invention.

As shown in FIG. 9, two modified Euclid algorithm calculation blocks are alternatively operated without delay although the time required for the modified Euclid algorithm calculation is comparatively longer than the time required for syndrome calculation.

The RS code has been widely used in various related fields such as digital communication and digital media. Also, the communication media technology has been dramatically developed. Therefore, it is expected to use a RS code having a better error correction capability, and the present invention may be effectively used for the RS code having the better error correction capability.

As described above, the RS decoding apparatus having a high error correction capability according to the present invention can perform the modified Euclid algorithm without delay by increasing the processing speed without increasing the operating clock, while having a minimum hardware complexity.

The above described method according to the present invention can be embodied as a program and stored on a computer readable recording medium. The computer readable recording medium is any data storage device that can store data which can be thereafter read by the computer system. The computer readable recording medium includes a read-only memory (ROM), a random-access memory (RAM), a CD-ROM, a floppy disk, a hard disk and an optical magnetic disk.

The present application contains subject matter related to Korean patent application No. KR 2005-0107048, filed with the Korean patent office on Nov. 9, 2005, the entire contents of which being incorporated herein by reference.

While the present invention has been described with respect to certain preferred embodiments, it will be apparent to those skilled in the art that various changes and modifications may be made without departing from the spirits and scope of the invention as defined in the following claims.

What is claimed is:

1. A Reed-Solomon decoding apparatus having a high error correction capability, comprising:
    a plurality of error location and analysis polynomial generating means, each of the plurality of error location and analysis polynomial generating means for
        receiving syndrome data in response to an enable signal and performing a modified Euclid algorithm,
        informing an operating state, the operating state being either an active state or an operation completion state upon receipt of the enable signal,
        suspending input of the syndrome data in response to receipt of a disable signal, and
        outputting error location polynomial data and error analysis polynomial data,
    wherein the plurality of error location and analysis polynomial generating means performs the modified Euclid algorithm independently;
    a controlling means for controlling the error location and analysis polynomial generating means and the input of the syndrome data by generating the enable signal and the disable signal according to the operating state; and
    a plurality of switching means for
        providing the syndrome data to the corresponding plurality of error location and analysis polynomial generating means upon receipt of the enable signal outputted from the controlling means, and
        controlling inputting of the syndrome data into the corresponding plurality of error location and analysis polynomial generating means upon receipt of the disable signal, where a number of the plurality of switching means is identical to a number of the plurality of error location and analysis polynomial generating means.

2. The Reed-Solomon decoding apparatus as recited in claim 1, wherein the plurality of error location and analysis polynomial generating means process the syndrome data in parallel, and wherein although a first error location and analysis polynomial generating means of the plurality of error location and analysis polynomial generating means does not end an operation when the syndrome data is inputted into the first error location and analysis polynomial generating means, a second error location and analysis polynomial generating means of the plurality of error location and analysis polynomial generating means receive the syndrome data and execute a modified Euclid algorithm without delay, the first error location and analysis polynomial generating means being different from the second error location and analysis polynomial generating means.

3. The Reed-Solomon decoding apparatus as recited in claim 1, wherein the number of the plurality of error location and analysis polynomial generating means is adjusted according to a required processing time, and each of the plurality of error location and analysis polynomial generating means is composed of a plurality of registers.

4. The Reed-Solomon decoding apparatus as recited in claim 3, wherein the number of the plurality of error location and analysis polynomial generating means is adjusted to satisfy a computation complexity for processing the modified Euclid algorithm in real-time by exchanging a control signal between each of the error location and analysis polynomial generating means and the controlling means.

5. A Reed-Solomon decoding method having a high error correction capability, comprising the steps of:
    a) at a controlling unit, generating an enable signal to operate a one of a plurality of error location and analysis polynomial generating units;
    b) receiving syndrome data in response to an enable signal and executing a modified Euclid algorithm at the one of the plurality of error location and analysis polynomial generating units, and receiving information about an operating state of the error location and analysis polynomial generating unit at the controlling unit;
    c) at the controlling unit, suspending inputting of the syndrome data by generating and sending a disable signal to the one of the plurality of error location and analysis polynomial generating units, and receiving information about completion of an operation from the one of the plurality of error location and analysis polynomial generating units; and
    d) at the controlling unit, generating the enable signal and the disable signal to operate the one of the plurality of error location and analysis polynomial generating units independently from at least one other of the plurality of error location and analysis polynomial generating units and executing a modified Euclid algorithm in parallel.

6. The method as recited in claim 5, wherein although the one of the plurality of error location and analysis polynomial generating units does not end an operation when the syndrome data is inputted into the one of the plurality of error location and analysis polynomial generating means, the at least one other of the plurality of error location and analysis polynomial generating units receives the syndrome data and executes a modified Euclid algorithm without delay.

7. The method as recited in claim 5, wherein the number of the plurality of error location and analysis polynomial generating units each of which is composed of a plurality of registers is adjusted according to a required processing time, and the number of the plurality of error location and analysis polynomial generating units is adjusted as many as to satisfy a computation complexity for executing the modified Euclid algorithm in real-time by exchanging a control signal between each of the plurality of error location and analysis polynomial generating units and the controlling unit.

* * * * *